US011322337B2

(12) United States Patent
Lubomirsky et al.

(10) Patent No.: US 11,322,337 B2
(45) Date of Patent: *May 3, 2022

(54) PLASMA PROCESSING SYSTEM WORKPIECE CARRIER WITH THERMALLY ISOLATED HEATER PLATE BLOCKS

(71) Applicant: APPLIED MATERIALS, INC.

(72) Inventors: Dmitry Lubomirsky, Cupertino, CA (US); Son T. Nguyen, San Jose, CA (US); Anh N. Nguyen, Milpitas, CA (US); David Palagashvili, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 805 days.

This patent is subject to a terminal disclaimer.

(21) Appl. No.: 15/594,297

(22) Filed: May 12, 2017

(65) Prior Publication Data

US 2017/0250060 A1   Aug. 31, 2017

Related U.S. Application Data

(63) Continuation of application No. 14/614,199, filed on Feb. 4, 2015, now Pat. No. 10,431,435.

(Continued)

(51) Int. Cl.
*H01J 37/32* (2006.01)
*H01L 21/67* (2006.01)
*H01L 21/687* (2006.01)

(52) U.S. Cl.
CPC .... *H01J 37/32724* (2013.01); *H01J 37/3244* (2013.01); *H01J 37/32082* (2013.01);
(Continued)

(58) Field of Classification Search
USPC ............... 118/728–730; 156/345.51–345.55; 361/234
See application file for complete search history.

(56) References Cited

U.S. PATENT DOCUMENTS 5,478,429 A   12/1995   Komino et al.
6,081,414 A    6/2000   Flanigan et al.
(Continued)

FOREIGN PATENT DOCUMENTS

CN        2786784    6/2006
CN      102160167    8/2011
(Continued)

OTHER PUBLICATIONS

Official Letter from Taiwan Patent Application No. 104124568, dated Aug. 28, 2019, 5 pgs.
(Continued)

*Primary Examiner* — Rakesh K Dhingra
(74) *Attorney, Agent, or Firm* — Schwabe, Williamson & Wyatt, P.C.

(57) ABSTRACT

A workpiece carrier is described for a plasma processing chamber that has isolated heater plate blocks. In one example, a plasma processing system has a plasma chamber, a plasma source electrically coupled with a showerhead included within the plasma chamber, a workpiece holder in a processing region of the plasma chamber having a puck to carry a workpiece, wherein the workpiece holder includes a heater plate having a plurality of thermally isolated blocks each thermally coupled to the puck, wherein each block includes a heater to heat a respective block of the heater plate, and wherein the workpiece holder includes a cooling plate fastened to and thermally coupled to the heater plate, the cooling plate defining a cooling channel configured to distribute a heat transfer fluid to transfer heat from the (Continued)

cooling plate, and a temperature controller to independently control each heater.

20 Claims, 7 Drawing Sheets

Related U.S. Application Data

(60) Provisional application No. 62/032,313, filed on Aug. 1, 2014.

(52) U.S. Cl.
CPC .. *H01J 37/32715* (2013.01); *H01L 21/67069* (2013.01); *H01L 21/67103* (2013.01); *H01L 21/67109* (2013.01); *H01L 21/67248* (2013.01); *H01L 21/68785* (2013.01); *H01J 2237/334* (2013.01)

(56) References Cited

U.S. PATENT DOCUMENTS

| | | | |
|---|---|---|---|
| 6,705,394 B1* | 3/2004 | Moslehi | C23C 16/4586 118/724 |
| 6,753,507 B2* | 6/2004 | Fure | H01L 21/67103 118/724 |
| 6,907,924 B2 | 6/2005 | Moslehi | |
| 7,161,121 B1 | 1/2007 | Steger | |
| 8,971,009 B2 | 3/2015 | Parkhe et al. | |
| 2002/0050246 A1 | 5/2002 | Parkhe | |
| 2004/0025791 A1 | 2/2004 | Chen et al. | |
| 2004/0065656 A1* | 4/2004 | Inagawa | C23C 16/4586 219/444.1 |
| 2005/0219786 A1 | 10/2005 | Brown et al. | |
| 2006/0137820 A1* | 6/2006 | Lee | H01J 37/32724 156/345.37 |
| 2006/0207725 A1 | 9/2006 | Oohashi et al. | |
| 2007/0224777 A1* | 9/2007 | Hamelin | C23C 16/4586 438/457 |
| 2007/0274020 A1 | 11/2007 | Park et al. | |
| 2009/0201622 A1 | 8/2009 | Brown et al. | |
| 2010/0039747 A1 | 2/2010 | Sansoni et al. | |
| 2011/0092072 A1 | 4/2011 | Singh et al. | |
| 2014/0177123 A1 | 6/2014 | Thach et al. | |
| 2014/0197151 A1 | 7/2014 | Volfovski et al. | |

FOREIGN PATENT DOCUMENTS

| | | |
|---|---|---|
| JP | H1050811 A | 2/1998 |
| JP | 2002508587 A | 3/2002 |
| JP | 2002-514010 | 5/2002 |
| JP | 2002-184558 | 6/2002 |
| JP | 2006-019565 | 1/2006 |
| JP | 2007525833 A | 9/2007 |
| JP | 2009231401 A | 10/2009 |
| JP | 2011-091172 | 5/2011 |
| JP | 2011091172 A | 5/2011 |
| KR | 20-0372083 | 1/2005 |
| TW | 201027661 | 7/2010 |
| TW | 201330164 | 7/2013 |
| WO | WO 9957753 | 11/1998 |
| WO | 2014099559 A1 | 6/2014 |

OTHER PUBLICATIONS

Notice of Reasons for Rejection from Japanese Patent Application No. 2017-505467 dated Aug. 9, 2019, 6 pgs.
Notice of First Office Action from Chinese Patent Application No. 201580049952.5 dated Aug. 5, 2019, 12 pgs.
International Preliminary Report on Patentability from PCT/US2015/041852 dated Jul. 23, 2015, 8 pgs.
PCT International Search Report and Written Opinion of the International Searching Authority for International Application No. PCT/US2015/041852, dated Oct. 27, 2015, 10 pages.
Office Action from Taiwan Patent Application No. 104124568 dated Dec. 13, 2018, 7 pgs.
Notice of the Second Office Action from Chinese Patent Application No. 201580049952 dated Mar. 5, 2020, 5 pgs.
Official Letter from Taiwan Patent Application No. 104124568 dated Jun. 5, 2020, 4 pgs.
Preliminary Rejection from Korean Patent Application No. 10-2017-7005752 dated Nov. 24, 2021, 7 pgs.
Notice of Reasons for Rejection from Japanese Patent Application No. 2020-028030 dated Jun. 29, 2021, 12 pgs.
Final Office Action from U.S. Appl. No. 14/614,199 dated Oct. 30, 2017, 14 pgs.
Final Office Action from U.S. Appl. No. 14/614,199 dated Oct. 2, 2018, 16 pgs.
Non-Final Office Action from U.S. Appl. No. 14/614,199 dated Jul. 25, 2017, 15 pgs.
Non-Final Office Action from U.S. Appl. No. 14/614,199 dated Apr. 10, 2018, 15 pgs.
Official Letter from Taiwan Patent Application No. 110105879 dated Dec. 3, 2021, 15 pgs.
Notice of Reasons for Rejection from Japanese Patent Application No. 2020-028030 dated Mar. 1, 2022, 8 pgs.

* cited by examiner

PLASMA PROCESSING SYSTEM WORKPIECE CARRIER WITH THERMALLY ISOLATED HEATER PLATE BLOCKS

CROSS-REFERENCE TO RELATED APPLICATIONS

This application is a continuation of prior U.S. patent application Ser. No. 14/614,199, filed Feb. 4, 2015, entitled WAFER CARRIER WITH INDEPENDENT ISOLATED HEATER ZONES, by Dmitry Lubomirsky, et al., the priority of which is hereby claimed and the contents of which are hereby incorporated by reference herein. This application also claims priority to prior U.S. Provisional Patent Application No. 62/032,313 filed Aug. 1, 2014, entitled WAFER CARRIER WITH INDEPENDENT ISOLATED HEATER ZONES, by Dmitry Lubomirsky, et al., the priority of which is hereby claimed and the contents of which are hereby incorporated by reference herein.

TECHNICAL FIELD

Embodiments of the present invention relate to the microelectronics manufacturing industry and more particularly to a workpiece carrier for a plasma processing chamber with isolated heater plate blocks.

BACKGROUND

In the manufacture of semiconductor chips a silicon wafer or other substrate is exposed to a variety of different processes in different processing chambers. The chambers may expose the wafer to plasmas, chemical vapors, metals, laser etching, and various deposition and acid etching processes in order to form circuitry and other structures on the wafer. During these processes, the silicon wafer may be held in place by a vacuum chuck or an electrostatic chuck (ESC). The chuck holds the wafer by generating an electrostatic field to clamp the back side of the wafer to a flat surface or puck surface of the chuck.

As fabrication techniques for plasma processing equipment advance, such as those designed to perform plasma etching of microelectronic devices and the like, the temperature of the wafer during processing becomes more important. Wafer chucks have been designed for thermal uniformity across the surface of the substrate, sometimes called a workpiece. Wafer chucks have also been designed for thermal non-uniformity across the surface of the wafer substrate. Liquid cooling is sometimes used to absorb the plasma power heat and remove it from the chuck. In some cases, independently controlled heaters are used in multiple zones. This allows for a wider process window under different process and plasma conditions.

In semi-conductor etch processing the temperature of a wafer during processing influences the rate at which structures on the wafer are etched. Other processes may also have a temperature dependence. This temperature influence is present, for example, in conductor etch applications in which very precise wafer temperature control helps to obtain a uniform etch rate. A more precise thermal performance allows for more precisely formed structures on the wafer. Controlled uniform and non-uniform etch rates across the wafer allow smaller structures to be formed on the wafer. Thermal performance or temperature control is therefore a factor in reducing the size of transistors and other structures on a silicon chip.

SUMMARY

A workpiece carrier is described for a plasma processing chamber that has isolated heater plate blocks. In one example, a plasma processing system has a plasma chamber, a plasma source electrically coupled with a showerhead included within the plasma chamber, a workpiece holder in a processing region of the plasma chamber having a puck to carry a workpiece, wherein the workpiece holder includes a heater plate having a plurality of thermally isolated blocks each thermally coupled to the puck, wherein each block includes a heater to heat a respective block of the heater plate, and wherein the workpiece holder includes a cooling plate fastened to and thermally coupled to the heater plate, the cooling plate defining a cooling channel configured to distribute a heat transfer fluid to transfer heat from the cooling plate, and a temperature controller to independently control each heater.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
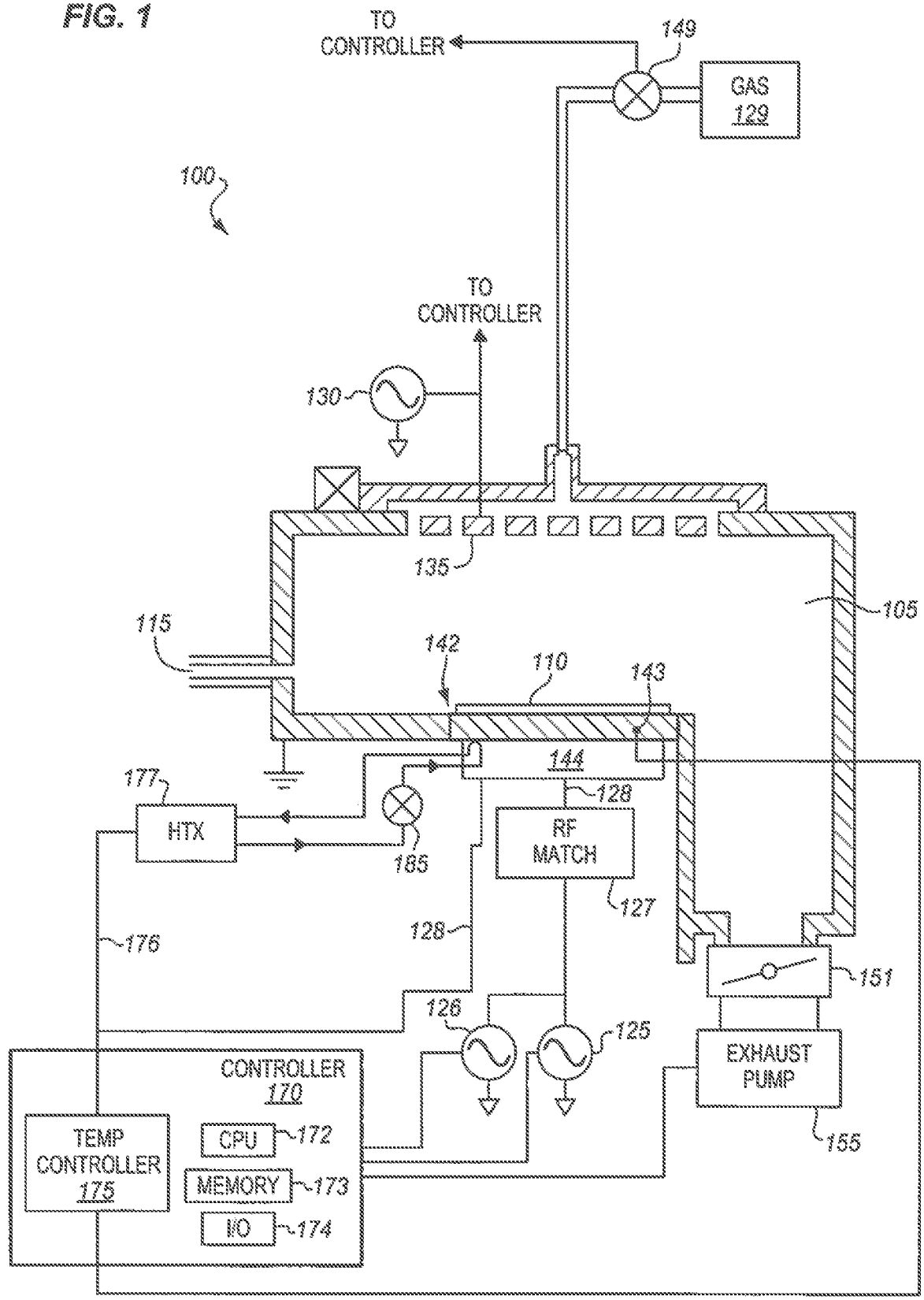
FIG. 1 is a schematic of a plasma etch system including a chuck assembly in accordance with an embodiment of the present invention.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

The temperature uniformity across the surface of a vacuum chuck has been improved with improved cooling plate and heater designs and improvements in bonding the cooling plate to the puck that holds the workpiece. However, these designs and processes are still subject to manufacturing variations, which can lead to significant thermal non-uniformity. For some implementations, a spatial temperature variation of less than +/− 0.3° C. across the wafer is desired. For other implementations, a difference of several degrees is desired from the center of the wafer to the edge.

In some implementations the critical dimensions of features on the wafer are controlled by controlling the temperature of the vacuum chuck. The temperature on the edge of a wafer in a plasma chamber may be much higher than the temperature near the center of the wafer. In addition, the temperature around the periphery of the wafer may vary due to inconsistencies in the chamber.

As described herein a multi-zone vacuum or electrostatic chuck may have multiple individual heater zones. Each heater zone has a heater, such as a resistive heater element and a temperature sensor, such as a thermocouple or RTD (Resistance Temperature Detector) to control each heater zone temperature individually based on active feedback from the sensor. Using a simple combined heater, thermocouple combination any number of heat zones may be provided, from 12 to much higher such as 64, 128, 256, or more and any number in between.

As described herein the heating and cooling of each zone (e.g. each pixel) may be achieved by heating an aluminum heater plate that applies heat to a wafer or other workpiece through a ceramic puck. The aluminum to ceramic interface connects adjacent pixels, but because of the low thermal conductivity of the ceramic puck, there is very little heat transfer between pixels through the ceramic in either a lateral or transverse direction.

While heat flow between pixels is reduced, the heat flux from each resistive heater to the workpiece is through the adhesive layer and the ceramic top plate of the chuck. Heat will be conducted through a cylindrical portion of a drilled hole that contains each heater and upwards along the sidewall of each pixel and perpendicular to the ceramic top plate. This allows for the temperature of each pixel to be individually and precisely controlled. As a result, the temperature of the workpiece carried by the chuck may be precisely controlled. The workpiece may be maintained at a consistent temperature across its surface or any desired thermal pattern may be achieved with hotter and cooler pixels as desired.

FIG. 1 is a schematic of a plasma etch system 100 including a chuck assembly 142 in accordance with an embodiment of the present invention. The plasma etch system 100 may be any type of high performance etch chamber known in the art, such as, but not limited to, Enabler®, DPS II®, AdvantEdge™ G3, EMAX®, Axiom®, or Mesa™ chambers, all of which are manufactured by Applied Materials of California, USA. Other commercially available etch chambers may similarly utilize the chuck assemblies described herein. While the exemplary embodiments are described in the context of the plasma etch system 100, the chuck assembly described herein is also adaptable to other processing systems used to perform any plasma fabrication process (e.g., plasma deposition systems, etc.)

Referring to FIG. 1, the plasma etch system 100 includes a grounded chamber 105. Process gases are supplied from gas source(s) 129 connected to the chamber through a mass flow controller 149 to the interior of the chamber 105. Chamber 105 is evacuated via an exhaust valve 151 connected to a high capacity vacuum pump stack 155. When plasma power is applied to the chamber 105, a plasma is formed in a processing region over a workpiece 110. A plasma bias power 125 is coupled into the chuck assembly 142 to energize the plasma. The plasma bias power 125 typically has a low frequency between about 2 MHz to 60 MHz, and may be, for example, in the 13.56 MHz band. In an example embodiment, the plasma etch system 100 includes a second plasma bias power 126 operating at about the 2 MHz band which is connected to an RF match 127. The plasma bias power 125 is also coupled to the RF match and also coupled to a lower electrode via a power conduit to supply the drive current 128. A plasma source power 130 is coupled through another match (not shown) to a plasma generating element 135 to provide high frequency source power to inductively or capacitively energize the plasma. The plasma source power 130 may have a higher frequency than the plasma bias power 125, such as between 100 and 180 MHz, and may, for example, be in the 162 MHz band.

A workpiece 110 is loaded through an opening 115 and clamped to the chuck assembly 142 inside the chamber. The workpiece 110, such as a semiconductor wafer, may be any wafer, substrate, or other workpiece employed in the semiconductor processing art and the present invention is not limited in this respect. The workpiece 110 is disposed on a top surface of a dielectric layer or puck of the chuck assembly that is disposed over a cooling base assembly 144 of the chuck assembly. A clamp electrode (not shown) is embedded in the dielectric layer. In particular embodiments, the chuck assembly 142 includes many different electrical heater zones (not shown). Each zone may be independently controllable to the same or to different temperature set points.

A system controller 170 is coupled to a variety of different systems to control a fabrication process in the chamber. The controller 170 may include a temperature controller 175 to execute temperature control algorithms (e.g., temperature feedback control) and may be either software or hardware or a combination of both software and hardware. The temperature controller receives temperature information from a thermal sensor 143 in the chuck and then adjusts the heaters and heat exchangers accordingly. While only one thermal sensor is shown, there may be many more in many different locations, depending on the particular implementation. The system controller 170 also includes a central processing unit 172, memory 173 and input/output interface 174. The temperature controller 175 is to output control signals or drive current 128 affecting the rate of heating and therefore the rate of heat transfer between each heater zone of the chuck assembly 142 and the workpiece In embodiments, in addition to the different heaters, there may be one or more coolant temperature zones. The coolant zones have heat transfer fluid loops with flow control that is controlled based on a temperature feedback loop. In the example embodiment, the temperature controller 175 is coupled through a control line 176 to a heat exchanger (HTX)/chiller 177 depending on the particular implementation. The control line may be used to allow the temperature controller to set a temperature, flow rate, and other parameters of the heat exchanger. The flow rate of the heat transfer fluid or coolant through conduits in the chuck assembly 142 may alternatively or additionally be controlled by the heat exchanger.

One or more valves 185 (or other flow control devices) between the heat exchanger/chiller 177 and fluid conduits in the chuck assembly 142 may be controlled by the temperature controller 175 to independently control a rate of flow of the heat transfer fluid. The temperature controller may also control the temperature set point used by the heat exchanger to cool the heat transfer fluid.

The heat transfer fluid may be a liquid, such as, but not limited to deionized water/ethylene glycol, a fluorinated coolant such as Fluorinert® from 3M or Galden® from Solvay Solexis, Inc. or any other suitable dielectric fluids such as those containing perfluorinated inert polyethers. While the present description describes a vacuum chuck in the context of a plasma processing chamber, the principle, structures, and techniques described herein may be used with a variety of different workpiece supports, in a variety of different chambers and for a variety of different processes.

Figure 2:
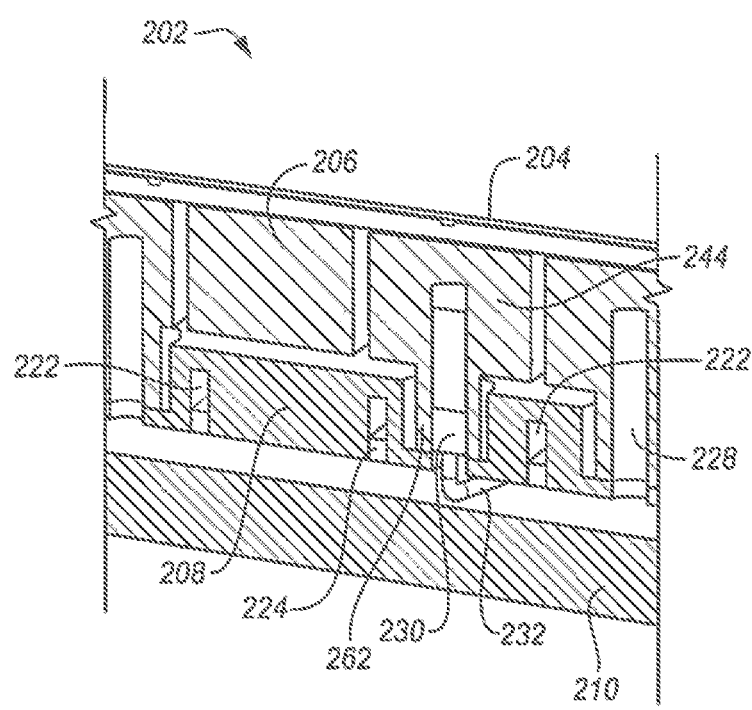
FIG. 2 is an isometric and cross-sectional view of a portion of an electrostatic chuck for supporting a wafer in accordance with an embodiment of the invention.

FIG. 2 is an isometric and cross-sectional view of a portion of an electrostatic chuck 202 for supporting a wafer for processing in a chamber such as, for example, the chamber of FIG. 1. A dielectric puck 204 is at the top of the chuck to carry the wafer. The dielectric puck is supported by a top plate 206 which, in turn, is supported by a cooling plate 208 which is carried by a base plate 210. The base plate is carried by a shaft (shown in FIG. 5). The chuck may be a vacuum chuck, pedestal, carrier, ESC, or similar type device.

The shaft and the base plate may be constructed of a variety of different materials including ceramics, Inconel®, aluminum and a variety of other materials. While the present invention will be described in the context of a vacuum chuck 202, alternatively, the chuck may use any of a variety of other techniques to hold the wafer against the dielectric puck 204 including electromagnetic force, electrostatic force, vacuum, and an adhesive.

The cooling plate has one or more cooling channels 222 to carry a coolant through the coolant plate 208. The coolant is supplied through the shaft 212 and pumped from the shaft to heat exchangers 177 to control the temperature of the coolant before it is pumped back into the chuck 202. The coolant channels 222 are capped by lids 224 at the bottom of the cooling plate. The channel lids 224 may also serve to seal the coolant plate against the base plate 210.

The cooling channels 222 are configured in concentric paths that correspond to concentric rings of heater blocks 244. This provides that there is at least one cooling channel in the cooling plate beneath each heater block. As shown in this cross-sectional view, each heater block 244 has a heater rod 230, that extends down into the cooling plate with a cylindrical extension 262 into a bore of the cooling plate. The cooling plate has a cooling channel on each side of the heater rod. The cooling plate and the heater plate are made of a thermally conducting material, such as aluminum. This allows the cooling channel to remove any excess heat. The base plate 210 is made of a material with lower thermal conductivity, such as titanium or ceramic to prevent the base plate from conducting heat across the cooling plate or to other components.

In operation, the heaters provide heat to each block while the cooling plate removes heat. This prevents any accumulation of heat so that the temperature for each block may be reduced simply by reducing the drive current for a heater. The combined effect of the cooling channel and the heater is to provide independent and precise control over each heater block.

The top plate has multiple slots 228 to carry a heater. In the illustrated example only one heater 230 is shown and two slots 228 are empty. However, a heater is typically placed in each one of the slots 228. As described in more detail below, the heaters are resistive heaters which generate heat in response to an applied current. The heaters also include an integral temperature sensor, such as a thermocouple, to sense the heat of the upper plate in the vicinity of the resistive heater. The heater is coupled through a wire conduit 232 which leads through to the shaft 212 to receive a heating current from an external controller such as the temperature controller 175 of FIG. 1. The sensed temperature is also sent through the wire conduit 232 down the shaft to the temperature controller so that the temperature of each heater can be regulated.

Figure 3:
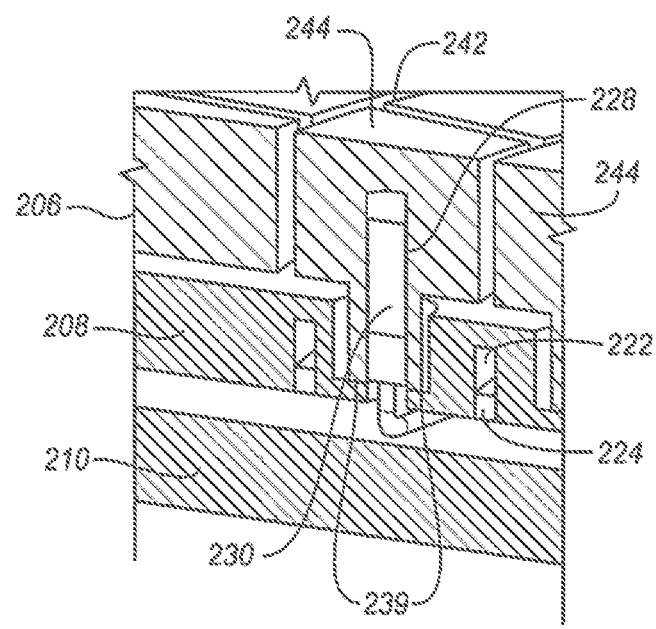
FIG. 3 is an isometric and cross-sectional view of a portion of an electrostatic chuck with the dielectric puck removed in accordance with an embodiment of the invention.

FIG. 3 shows a portion of the vacuum chuck 202 in cross-section with the dielectric puck 204 removed. The configuration of the upper surface of the top plate 206 can easily be seen. The top plate may be formed of aluminum or some other heat conducing material. The top plate may be machined to have the grooves and holes shown in the figures. The top plate functions as a heater plate because it has multiple slots 228 each of which holds an independently controlled heater element 230. The top plate is machined with grooves 242 which form multiple isolated heating blocks 244. The slots form a thermal isolation barrier between each block or pixel. The grooves may be filled with air, an ambient gas within the chamber, or solid insulating or foam material. Each separate block forms a thermally independent island isolated from the other blocks by the grooves 242.

Each block has its own independently controlled heater 230 which applies heat to the blocks. In addition to the independent heating blocks the cooling plate may also include holes for lift pins, purge and other gases, vacuum channels and for other purposes (not shown).

Each heater rod 230 may be mounted into a corresponding slot 228 using a friction fit, a thermal paste or any other adhesive. A heater rod may have a cylindrical housing so that the walls of the housing contact the walls of the slot. In order to obtain the best control over the heat of each pixel, the heater rod is installed so that it has good thermal conduction with the rest of the block. This allows the block to heat quickly. In some cases the heater rod may include a temperature sensor, such as a thermocouple or thermal diode. Better thermal conduction between the heater rod and the block will provide more accurate temperature measurement by the heater rod.

In another embodiment, the heater rod does not have a housing but is assembled and installed into each respective slot. In this case the heating element of the heater rod, such as resistive copper windings are installed into the slot directly and held in place with a suitable thermal paste or other adhesive. Attaching the heating element or windings directly to the slot provides better thermal conductivity to the respective heater block but may be more difficult to assemble.

Each block 244 of the heater plate 206 has a heat transfer surface 239 near the heater rod that directly contacts the cooling plate 208. As shown, the heater transfer surface is at the bottom end of the heater block extension, however, the invention is not so limited. A heat transfer surface may be placed in other positions. This surface allows for thermal transfer from the heating block to the cooling plate. The rest of the block is isolated from the cooling plate by the air gap 242. By controlling the size and location of the heat transfer surface the thermal characteristics of the assembly may be designed. The two components are joined together at the heat transfer surface using a technique to maximize heat conduction through the connection. In one example a thermal paste is used. In another example, the two surfaces are brazed together.

The coolant plate 208, in contrast to the heater plate, does not isolate each of the individual heating zones formed by the blocks of the top plate, however, the invention is not so limited. Each thermal block has a covered 224 coolant channel 222 on each of two opposite sides of the heater rod. In the illustrated embodiment, the coolant channels are roughly aligned with the grooves 242 between each heating zone. As a result, each block is heated at its center and cooled along two sides. This further thermally isolates each block from each other block by putting a cool zone between each block. In addition, it allows the temperature of each block to be lowered so that the specific temperature may be controlled by the heater rather than by the coolant fluid.

Figure 4:
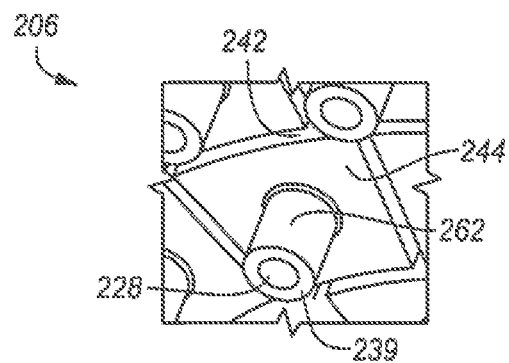
FIG. 4 is an isometric bottom view of a heating plate of a pedestal in accordance with an embodiment of the invention.
Figure 5:
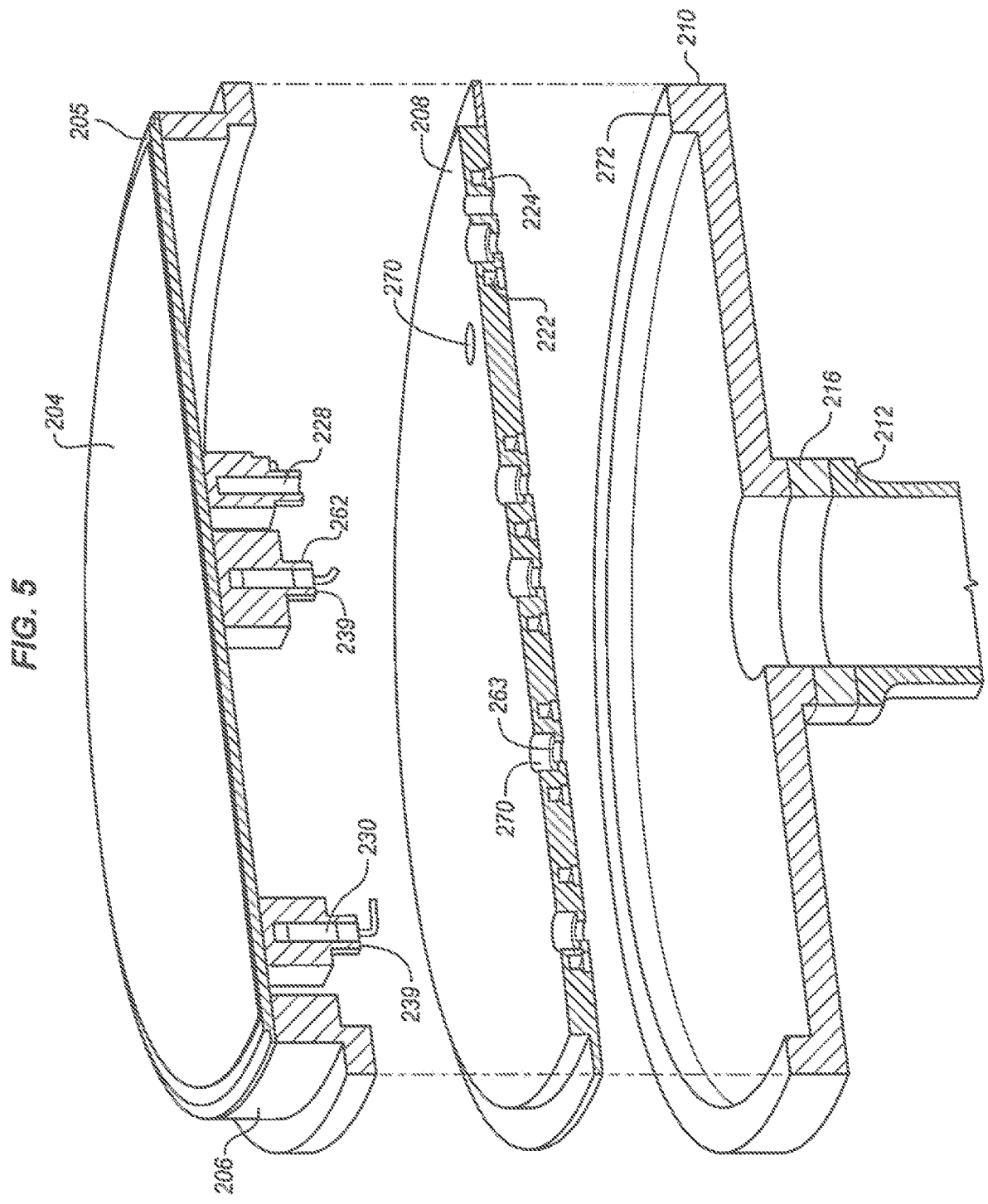
FIG. 5 is an isometric exploded and cross-sectional view from above of a pedestal for supporting a wafer in accordance with an embodiment of the invention.

FIG. 4 shows a portion of the heating plate 206 in an isometric view from the underside. Each of the slots 228 extend through a cylindrical shaft-like extension 262 from its respective thermally isolated block 244. The cylinder 262 has a central slot 228 for holding the heater 230. The cylinder fits inside a corresponding bore of the cooling plate as described below. The heat transfer surface 239 of the cylinder is circular. It is placed adjacent to the heater rod inside and surrounds the heater rod at one end. The heat transfer surface mates with a seat 263 (as shown in FIG. 5) in a corresponding counter bore 270 (as shown in FIG. 5) in the cooling plate. The grooves 242 between the thermally isolated blocks extend all the way through the cooling plate as shown from the underside of the heater plate.

FIG. 5 is an exploded diagram of the vacuum chuck of FIG. 2. As shown, a primary support shaft 212 supports a base plate 210 with an isolated thermal break 216 between the support shaft and the base plate. The base plate supports the cooling plate 208. The cooling plate has cooling channels 222 which circulate a coolant fluid through the interior of the chuck. Each cooling channel is capped with a cover 224 after the channel has been milled into the cooling plate. The cooling plate is typically machined from aluminum and then covered with elastomer caps for each of the cooling channels.

The cooling plate absorbs heat from the embedded heaters 230 through the heater plate and from a workpiece through the ceramic top plate or puck 204. The temperature uniformity depends on the quality of the ceramic puck 204, the elastomer bond between the top surface 205 of the top plate and the puck 204, and the cooling plate channels 224. It also depends on how well heat is transferred from the workpiece to the ceramic puck. All of these factors are subject to variations in manufacture and use.

A top surface 205 of the top plate 206 is bonded to the dielectric puck 204 with a high temperature adhesive, such as silicone. The puck is typically ceramic but may alternatively be made with other materials. In the case of an electrostatic chuck, electrodes (not shown) are embedded within the puck to generate an electrostatic field with which to grip a workpiece, such as a silicon substrate.

The base plate 210 provides a structural reinforcement to the cooling plate 208. The base plate may be formed from a rigid material that has poor thermal conductivity. This prevents heat flow between cooling channels through the base plate. The base plate may be formed from titanium, alumina, ceramic, stainless steel, nickel, and similar materials. It may be formed of a single piece or several parts brazed together. The base plate may be bolted, screwed or riveted to the cooling plate, depending on the particular implementation.

The cooling plate has a cylindrical counter bore 270 for each of the cylindrical heater element carriers 262. These cylindrical bores surround the slots 228 which each extend down into a respective counter bore 270. A central hole extends through the counter bores all the way through the cooling plate to allow wires for electrical connections to be made through the cooling plate into the support shaft 212. The wires for each heater and each thermal sensor pass through the respective counter bore 270 hole and are gathered around the base plate 210 to collect into a conduit (not shown) through the support shaft 212. The top heater plate fits into the coolant plate so that each cylinder passes into a respective counter bore.

The cylinders 262 for each heater rod extend into each respective counter bore 270 so that the heat transfer surface 239 seats against a respective ledge or seat 263 of each counter bore. These surface are connected together to promote heat transfer between each heater plate block and the cooling plate The base plate 210 is carried on a shaft 212. The shaft is hollow inside and includes conduits for conductors, gases and other materials that are supplied to the top of the chuck. An isolator 216 is placed between the metal shaft and the metal base plate 210 to reduce the conduction of heat between the shaft and the base plate. This keeps the shaft cooler and also shields heat from any handling mechanism that may be attached to the shaft.

Figure 6:
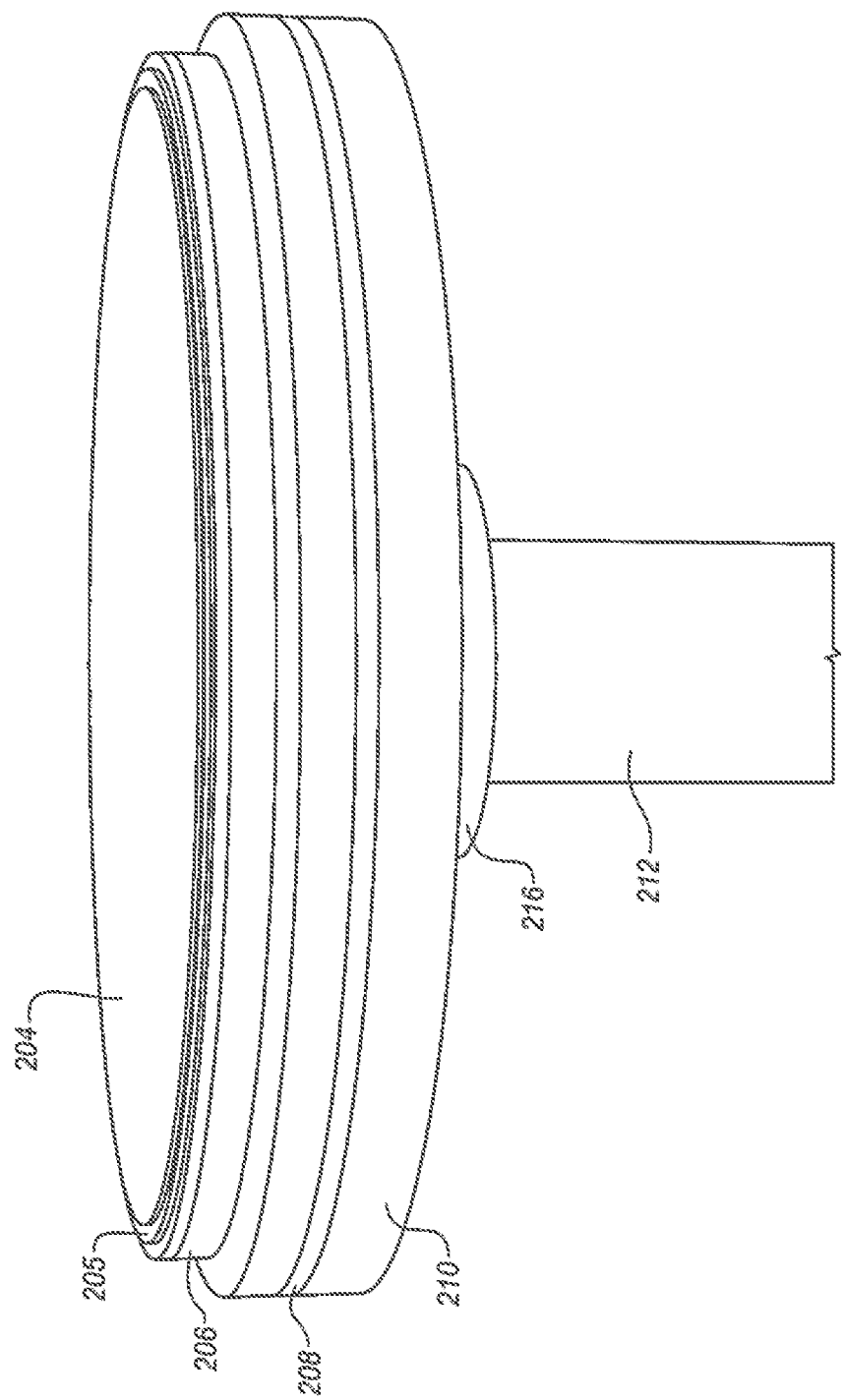
FIG. 6 is an isometric assembled side view of the pedestal of FIG. 5 in accordance with an embodiment of the invention.

FIG. 6 is an isometric view of the assembled ESC of FIG. 5. The support shaft 212 supports the base plate 210 through the isolator 216. The cooling plate 208 and heater plate 206 are carried by the base plate. The top heater plate 206 carries the puck 204 on the top surface 205 of the heater plate. A workpiece (not shown) is in turn carried above the puck and may be attached electrostatically or in another way.

The vacuum chuck as shown and described is able to individually control the temperature of each of the isolated blocks of the heating plate. This allows local areas on the top dielectric puck 204 to be controlled which allows fine control over the temperature of the wafer in each of these small heating zones of the wafer. The heat is primarily controlled by activating a respective heater element in an appropriate heating zone. Each of the zones is thermally isolated from each other zone by the grooves that are machined into the top heater plate. The individual blocks are cooled using the coolant and coolant channels that are a part of the coolant plate.

Figure 7:
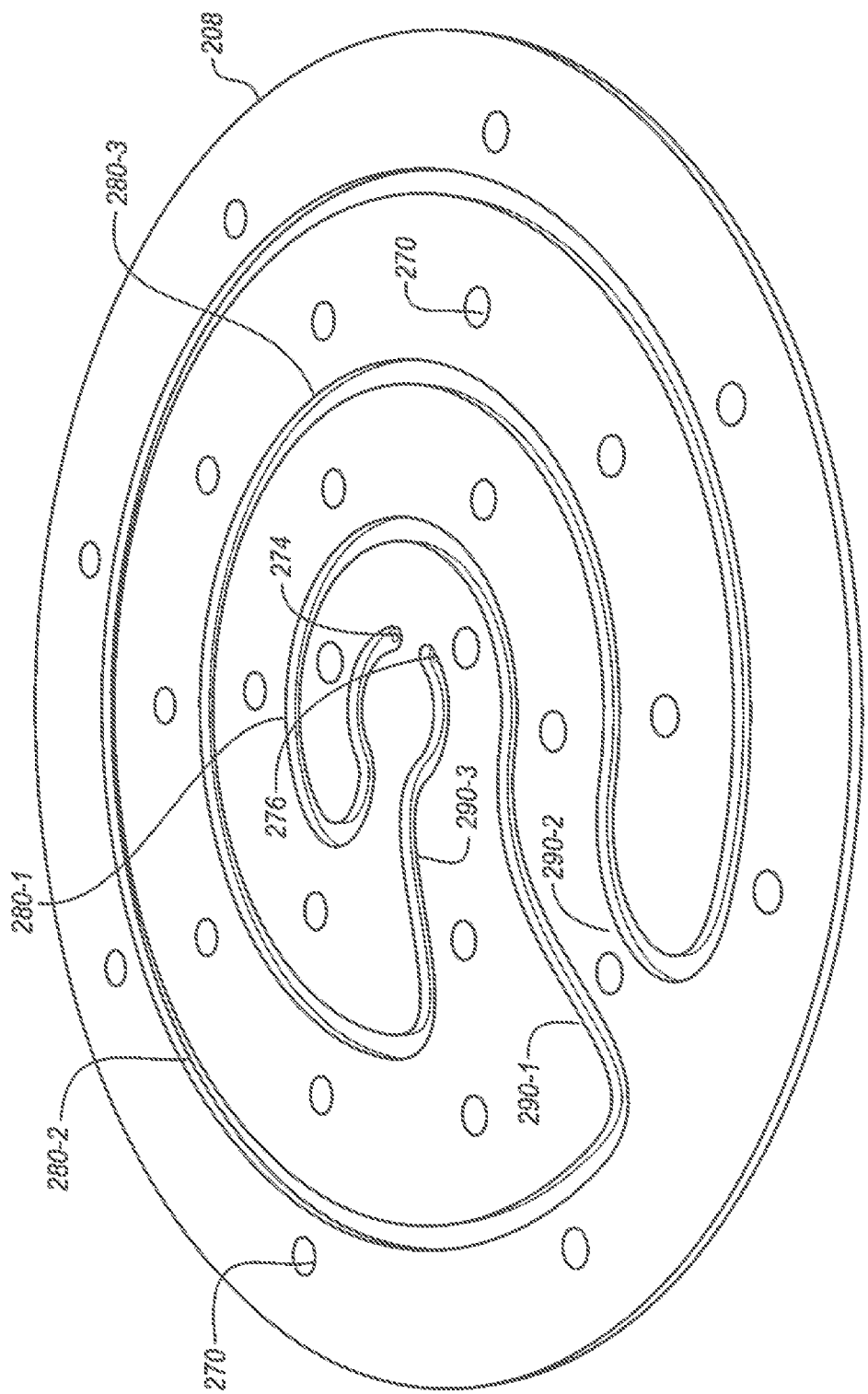
FIG. 7 is a bottom isometric view of a cooling plate of a pedestal in accordance with an embodiment of the invention.

FIG. 7 is a bottom isometric view of the cooling plate 208 to show one example configuration of the cooling channels. In use, the cooling channel will have a cover 224 (not shown) to seal the channel for the flow of coolant through the cooling plate. The cooling plate is made of a material with a high thermal conductivity so that heat absorbed from the heater blocks is conducted and absorbed by coolant flowing through the channels. In this example, there is an inlet 274 and an outlet 276 to the coolant channels. The inlet and outlet are placed near the middle of the cooling plate for easy access from the central support shaft through which the coolant fluid is supplied. Other locations may be used for other types of supply configurations. As shown, the coolant flows from the inlet radially outwards to a first circular channel 280-1. The holes 270 for at least some of the heater elements are visible and it can be seen that the circular path of the first circular channel 280-1 flows in between the holes of the first and second rows of the heater blocks. The path of the channel then traverses radially outward in a radial section 290-1 to a second concentric circular path 280-2.

This second circular path is concentric to the first one and between the third and fourth circular rows of thermally isolated blocks. The path travels between the blocks on the third row and the fourth row for its outermost course and then comes to a second radial section 290-2 which takes the cooling channel to an intermediate path. The third concentric circle 280-3 travels concentrically around the cooling plate between the second and third row. The third radial section takes the cooling channel radially inward towards the center of the cooling plate to travel between the second and third rows of cooling blocks. This concentric path 280-3 travels around the cooling channel and has yet another radial arm 290-3 which takes the channel to its outlet 276. From the outlet, the coolant flows down to the central support shaft.

The illustrated type of flow path takes into consideration that the coolant fluid is cooler as it first comes into the cooling plate from the inlet 274 than it is when it comes to the exit 276. As the coolant fluid travels through the coolant channel it absorbs heat from the cooling plate which has been heated by the upper heater plate so that the fluid is warmed through its path. The circular channel alternates between the rows so that each independent heater block has an outward flowing coolant channel on one side and an inward flowing coolant channel on the other side. In other words, the coolant fluid passing along one edge of the block will be cooler than the fluid passing along the other edge of the block. This is true for each of the coolant blocks so that the overall cooling effect is balanced due to heat conduction through the plate across each of the blocks.

A variety of other configurations may be used to promote more even cooling for all of the heater blocks. The heater blocks may be arranged in straight lines in differently shaped curves, in a mesh etc. The heater blocks may be rectangular as shown or another shape such as triangular, hexagonal, or with some other number of sides. The heater blocks may have curved sides or straight sides. The different configurations may be adapted to different configurations of blocks and to different coolant configurations. As an alternative, or in addition, there may be multiple independent cooling channels each connected through the support shaft to different heat exchangers.

The coolant plate in contrast to the heater plate does not necessarily isolate each of the individual heating zones formed by the blocks of the top plate. As shown in FIG. 7 the coolant channels may be formed in the shape of concentric rings. As shown in FIG. 2 each thermal block has a coolant channel on each of two opposite sides. In the illustrated embodiment, the coolant channels are roughly aligned with the grooves 242 between each heating zone. As a result, each block is heated at its center and cooled along two sides. This further thermally isolates each block from each other block by putting a cool zone between each block. In addition, it allows the temperature of each block to be lowered so that the specific temperature may be controlled by the heater rather than by the coolant fluid.

As suggested by the holes 270 of FIG. 7, the isolated blocks 244 around the top plate are arranged in a concentric pattern. In this example, there are four circular rings formed by a concentric pattern of blocks. The blocks of the inner ring and each outer concentric ring are divided by radial lines that isolate the blocks from each other. After the first ring of blocks there are three more circular rings of blocks surrounding each previous ring in successive concentric rings. Each ring of blocks has more blocks than the adjacent more central ring because the diameters of the rings increase toward the edge or perimeter of the plate.

The number of individual, independent heating blocks may be configured to suit any particular application and to provide any desired level of precision. This size and number of blocks may also be adjusted to suit different sizes of workpieces. A typical 300 mm wafer in a typical plasma process may have different needs than another wafer. More blocks may be used for more precise thermal control or to allow more heaters to apply more combined total heat to the wafer. Alternatively, fewer blocks may be used where less precise control or less overall heating power is desired.

Figure 8:
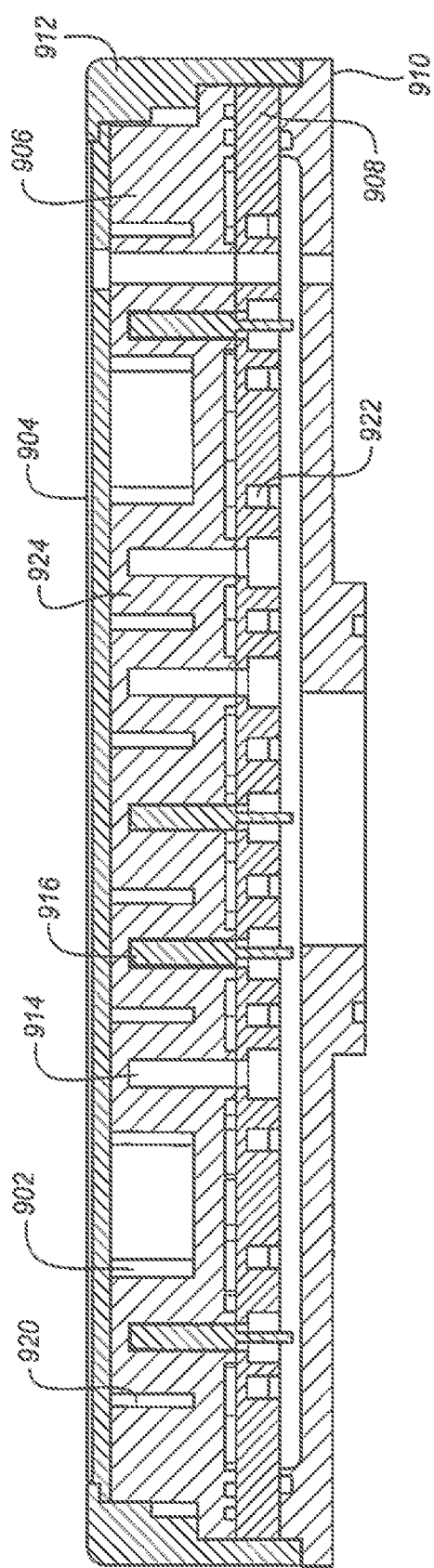
FIG. 8 is side cross-sectional view of an alternative pedestal for supporting a wafer in accordance with an embodiment of the invention.

FIG. 8 shows an alternative configuration for a vacuum chuck assembly. In the example of FIG. 8, a top dielectric puck 904 is carried on a top heater plate 906 which rests over a cooling plate 908. The top plate 906 is fastened to a base plate 910. An edge ring 912 may be used all around the edge of the plates to hold the chuck assembly together. As in the previous example, the heater plate is shown with a large number of slots 914 of which seven are visible to carry heater elements 916. While only four slots carry heater elements and three slots do not carry a heater element, as shown, after final assembly each of the slots will contain a heater element which can independently be controlled.

In this example, the slots are not carried in circular bores that extend into the cooling plate, instead the heater elements rest directly over the cooling plate and do not extend into counter bores in the cooling plate. In addition, there are grooves 920 to isolate the heating blocks from each other. These grooves extend two-thirds to three-quarters of the way through the top heater plate and not all the way to the cooling plate. This allows for a higher level of structural rigidity for the heater plate and still provides a significant amount of isolation between each of the heater blocks. The coolant channels 922 extend around the cooling plate 908 in between each of the heater blocks 924 in a manner similar to that of FIG. 3.

FIG. 8 shows that the specific proportions, dimensions and shapes of the various elements described herein may be modified to meet different needs for strength, thermal isolation and thermal control.

When the workpiece is heated in the plasma chamber, the heat from the dielectric puck will be absorbed by the heater plate and the cooling plate. The heater plate and the cooling plate may be made of a material with a high thermal conductivity, such as aluminum or some other metal. This allows the heat to be transferred from the aluminum heating blocks, to the cooling plate into the coolant fluid in the cooling channels. The air gap between each part of the heater plate inhibits the transfer of heat between each block of the heater plate. Due to this air gap, and because the dielectric puck is a poor thermal conductor, the temperature of the dielectric puck can be divided into all of the zones.

Any other low thermal conductivity divider may alternatively be used between each block, such as silicone or ceramic. The groves in the heater plate may be filled with a thermal isolation material. This isolates the temperature of each block from each other block. The air gap or other thermal barrier in the grooves reduces the thermal crosstalk between the block to allow for more precise and more isolated control of the temperature of each block. While an aluminum plate with air spaces between each block is described herein, the heater plate may be made of a variety of different materials with a high thermal conductivity. The interface between each of the blocks may be an air gap as described or the gaps may be filled using a low thermal conductivity material such as an adhesive, a ceramic, or some other part.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A plasma processing system comprising:
   a plasma chamber;
   a plasma source electrically coupled with a showerhead included within the plasma chamber;
   a workpiece holder in a processing region of the plasma chamber having a puck to carry a workpiece, wherein the workpiece holder includes a heater plate having a plurality of separate thermally isolated blocks each thermally coupled to the puck,
   wherein each block includes a heater to heat a respective block of the heater plate, and
   wherein the workpiece holder includes a cooling plate fastened to and thermally coupled to the heater plate, the cooling plate including a cooling channel configured to distribute a heat transfer fluid to transfer heat from the cooling plate, wherein the heater extends down into the cooling plate, and the cooling channel laterally adjacent to the heater; and
   a temperature controller to independently control each heater.

2. The plasma processing system of claim 1, wherein the heaters comprise longitudinal resistive heater rods oriented with their longitudinal axis perpendicular to a top surface of the puck.

3. The plasma processing system of claim 1, wherein the blocks of the heater plate are thermally isolated from each other block by a gap between each block.

4. The plasma processing system of claim 3, wherein the gap is filled with an insulating material.

5. The plasma processing system of claim 1, wherein the blocks are arranged in concentric rings across a surface of the heater plate and wherein the blocks are either rectangular, triangular, or hexagonal with straight or curved sides.

6. The plasma processing system of claim 1, wherein the heater blocks have a heat transfer surface in physical contact with the cooling plate to transfer heat from each respective heater block to the cooling plate.

7. The plasma processing system of claim 6, wherein the heater blocks and the cooling plate are formed of aluminum and the heat transfer surface is brazed to the cooling plate.

8. The plasma processing system of claim 6, wherein the heat transfer surface is adjacent to and surrounds the heater.

9. The plasma processing system of claim 1, further comprising a base plate fastened to the cooling plate opposite the puck, and wherein the cooling channels are open to the base plate, the workpiece holder further comprising a plurality of seals to seal the cooling channels against the base plate.

10. The plasma processing system of claim 9, wherein the base plate is formed of a material with lower thermal conductivity than the cooling plate.

11. The plasma processing system of claim 10, wherein the material is selected from titanium, stainless steel, alumina, ceramic, and nickel.

12. A plasma processing chamber comprising:
    a chamber housing defining a plasma processing region of the plasma processing chamber;
    an inlet defined at a top of the plasma processing chamber, wherein the inlet is configured to receive precursors into the chamber;
    a substrate support, comprising:
    a puck, a heater plate having a plurality of separate thermally isolated blocks each thermally coupled to the puck, wherein each block includes a heater to heat a respective block of the heater plate, and a cooling plate fastened to and thermally coupled to the heater plate, the cooling plate including a cooling channel configured to distribute a heat transfer fluid to transfer heat from the cooling plate, wherein the heater extends down into the cooling plate, and the cooling channel laterally adjacent to the heater; and
    a temperature controller to independently control each heater.

13. The plasma processing chamber of claim 12, wherein the heaters comprise longitudinal resistive heater rods oriented with their longitudinal axis perpendicular to a top surface of the puck.

14. The plasma processing chamber of claim 12, wherein the blocks of the heater plate are thermally isolated from each other block by a gap between each block.

15. The plasma processing chamber of claim 14, wherein the gap is filled with an insulating material.

16. The plasma processing chamber of claim 12, wherein the blocks are arranged in concentric rings across a surface of the heater plate and wherein the blocks are either rectangular, triangular, or hexagonal with straight or curved sides.

17. The plasma processing chamber of claim 12, wherein the heater blocks have a heat transfer surface in physical contact with the cooling plate to transfer heat from each respective heater block to the cooling plate.

18. The plasma processing chamber of claim 17, wherein the heater blocks and the cooling plate are formed of aluminum and the heat transfer surface is brazed to the cooling plate.

19. The plasma processing chamber of claim 17, wherein the heat transfer surface is adjacent to and surrounds the heater.

20. A processing chamber comprising:
a chamber housing defining a plasma processing region of the processing chamber;
an inlet defined at a top of the processing chamber, wherein the inlet is configured to receive precursors into the chamber;
a substrate support, comprising:
a puck, a heater plate having a plurality of separate thermally isolated blocks each thermally coupled with the puck, wherein each block includes a heater to heat a respective block of the heater plate, and a cooling plate thermally coupled with the heater plate, the cooling plate including a cooling channel configured to distribute a heat transfer fluid to transfer heat from the cooling plate, wherein the heater extends down into the cooling plate, and the cooling channel laterally adjacent to the heater;
a temperature controller to independently control each heater; and
a showerhead positioned within the chamber housing, wherein the showerhead is electrically coupled with a plasma source configured to generate a plasma within the processing chamber.

* * * * *